(12) United States Patent
Furuta et al.

(10) Patent No.: US 11,164,897 B2
(45) Date of Patent: Nov. 2, 2021

(54) DISPLAY DEVICE

(71) Applicant: Sharp Kabushiki Kaisha, Sakai (JP)

(72) Inventors: Shige Furuta, Sakai (JP); Hiroyuki Adachi, Sakai (JP); Keiichi Ina, Sakai (JP); Takahiro Yamaguchi, Sakai (JP); Yuhichiroh Murakami, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/063,741

(22) Filed: Oct. 6, 2020

(65) Prior Publication Data

US 2021/0126017 A1    Apr. 29, 2021

Related U.S. Application Data

(60) Provisional application No. 62/926,592, filed on Oct. 28, 2019.

(51) Int. Cl.
*G09G 5/00* (2006.01)
*H01L 27/12* (2006.01)
*G09G 3/36* (2006.01)
*G06F 3/044* (2006.01)

(52) U.S. Cl.
CPC ............ *H01L 27/124* (2013.01); *G06F 3/044* (2013.01); *G09G 3/3688* (2013.01)

(58) Field of Classification Search
CPC ...... G09G 3/3688; G06F 3/044; H01L 27/124
See application file for complete search history.

(56) References Cited

U.S. PATENT DOCUMENTS

| 7,362,321 | B2* | 4/2008 | Kumada | G09G 3/3614 345/208 |
| 7,898,515 | B2* | 3/2011 | Moon | G09G 3/3655 345/96 |
| 8,411,240 | B2* | 4/2013 | Harada | G09G 3/3655 349/130 |
| 9,024,913 | B1 | 5/2015 | Jung et al. | |
| 2002/0080109 | A1* | 6/2002 | Nagata | G09G 3/3688 345/92 |
| 2002/0140650 | A1* | 10/2002 | Kai | G09G 3/3688 345/87 |
| 2008/0074572 | A1* | 3/2008 | Kim | G02F 1/134363 349/44 |
| 2008/0079680 | A1* | 4/2008 | Fujita | G09G 3/3688 345/89 |
| 2014/0333862 | A1* | 11/2014 | Harada | G02F 1/13306 349/41 |

(Continued)

FOREIGN PATENT DOCUMENTS

JP    2015-210811 A    11/2015

*Primary Examiner* — Joe H Cheng
(74) *Attorney, Agent, or Firm* — Keating & Bennett, LLP

(57) ABSTRACT

The display device includes, on a substrate, a plurality of pixel electrodes, M (M is a natural number equal to or greater than three) counter electrodes disposed opposite the plurality of pixel electrodes, M counter electrode wiring lines connected with M counter electrodes, and N (N is a natural number and 2≤N<M) common voltage wiring lines connected to the M counter electrode wiring lines. Counter electrode wiring lines connected to counter electrodes adjacent to each other are connected to common voltage wiring lines that are different from each other.

5 Claims, 19 Drawing Sheets

(56) References Cited

U.S. PATENT DOCUMENTS

2016/0283032 A1\* 9/2016 Kim .................... G02F 1/13338
2017/0068142 A1\* 3/2017 Liu .................... G02F 1/134309
2017/0090239 A1\* 3/2017 Jung .................... G06F 3/0412
2017/0153511 A1\* 6/2017 Um .................... G02F 1/133512

\* cited by examiner

DISPLAY DEVICE

CROSS-REFERENCE TO RELATED APPLICATIONS

This application claims the benefit of priority to U.S. Provisional Application No. 62/926,592 filed on Oct. 28, 2019. The entire contents of the above-identified application are hereby incorporated by reference.

BACKGROUND

Technical Field

The disclosure disclosed below relates to a display device.

JP 2015-210811 A discloses an in-cell touch panel display device in which a touch sensor is provided on an active matrix substrate. The touch panel display device is provided with a plurality of divided common electrodes on the display panel. Each of the common electrodes is connected to a different sensor line from each another. Each of the sensor lines is connected to a switching element. The touch panel display device has a display drive period and a touch sensor drive period. The switching element of each of the sensor lines is turned on during the display drive period, and the sensor line is applied a common voltage signal from the feed line via the switching element. The switching element of each of the sensor lines is turned off during the touch sensor drive period, and a touch drive signal is supplied to the sensor line.

Because the common electrodes are also used as the touch sensor, touch detection is not performed correctly in a case where short-circuits occur between adjacent common electrodes. The disclosure disclosed below provides a display device that can detect short-circuits of common electrodes (counter electrodes) that function not only for display but also as a touch sensor.

SUMMARY

In light of the problems described above, a display device includes: a substrate; a plurality of pixel electrodes disposed on the substrate; M (M is a natural number equal to or greater than three) counter electrodes disposed opposite the plurality of pixel electrodes; M counter electrode wiring lines connected to the M counter electrodes; and N (N is a natural number and 2≤N<M) common voltage wiring lines connected to the M counter electrode wiring lines, wherein counter electrode wiring lines connected to counter electrodes adjacent to each other are connected to common voltage wiring lines different from each other.

According to the configuration described above, it may be possible to detect the presence or absence of short-circuits of the counter electrodes that function not only for display but also as a touch sensor.

BRIEF DESCRIPTION OF DRAWINGS

The disclosure will be described with reference to the accompanying drawings, wherein like numbers reference like elements.

DESCRIPTION OF EMBODIMENTS

Figure 1:
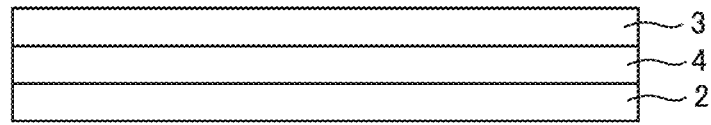
FIG. 1 is a schematic cross-sectional view illustrating a display device according to a first embodiment.

Hereinafter, embodiments of the disclosure will be described in detail with reference to the drawings. In the drawings, identical or corresponding parts are denoted by the same reference signs, and the description thereof will not be repeated.

First Embodiment

FIG. 1 is a schematic cross-sectional view illustrating a display device according to the present embodiment. A display device 1 according to the present embodiment includes an active matrix substrate 2, a counter substrate 3, and a liquid crystal layer 4 sandwiched between the active matrix substrate 2 and the counter substrate 3.

Each of the active matrix substrate 2 and the counter substrate 3 includes a glass substrate that is substantially transparent (having high translucency). Although not illustrated in the drawing, in FIG. 1, the display device 1 includes a backlight provided on the opposite side of the active matrix substrate 2 from the liquid crystal layer 4. The display device 1 is provided with a pair of polarizers (not illustrated) that sandwich the active matrix substrate 2 and the counter substrate 3 in FIG. 1.

The counter substrate 3 includes, for example, three-color filters of red (R), green (G), and blue (B) (not illustrated).

The display device 1 has a function of displaying an image, and has a function of detecting a position touched by a user (touch position) on the displayed image. The display device 1 is a so-called in-cell touch panel display device in which elements necessary to detect touch positions are provided on the active matrix substrate 2.

In the display device 1, the driving method of the liquid crystal molecules included in the liquid crystal layer 4 is a transverse electrical field driving method. In order to achieve the transverse electrical field driving method, pixel electrodes and counter electrodes (common electrodes) for forming electrical fields are formed on the active matrix substrate 2. Hereinafter, a configuration of the active matrix substrate 2 will be specifically described.

Figure 2:
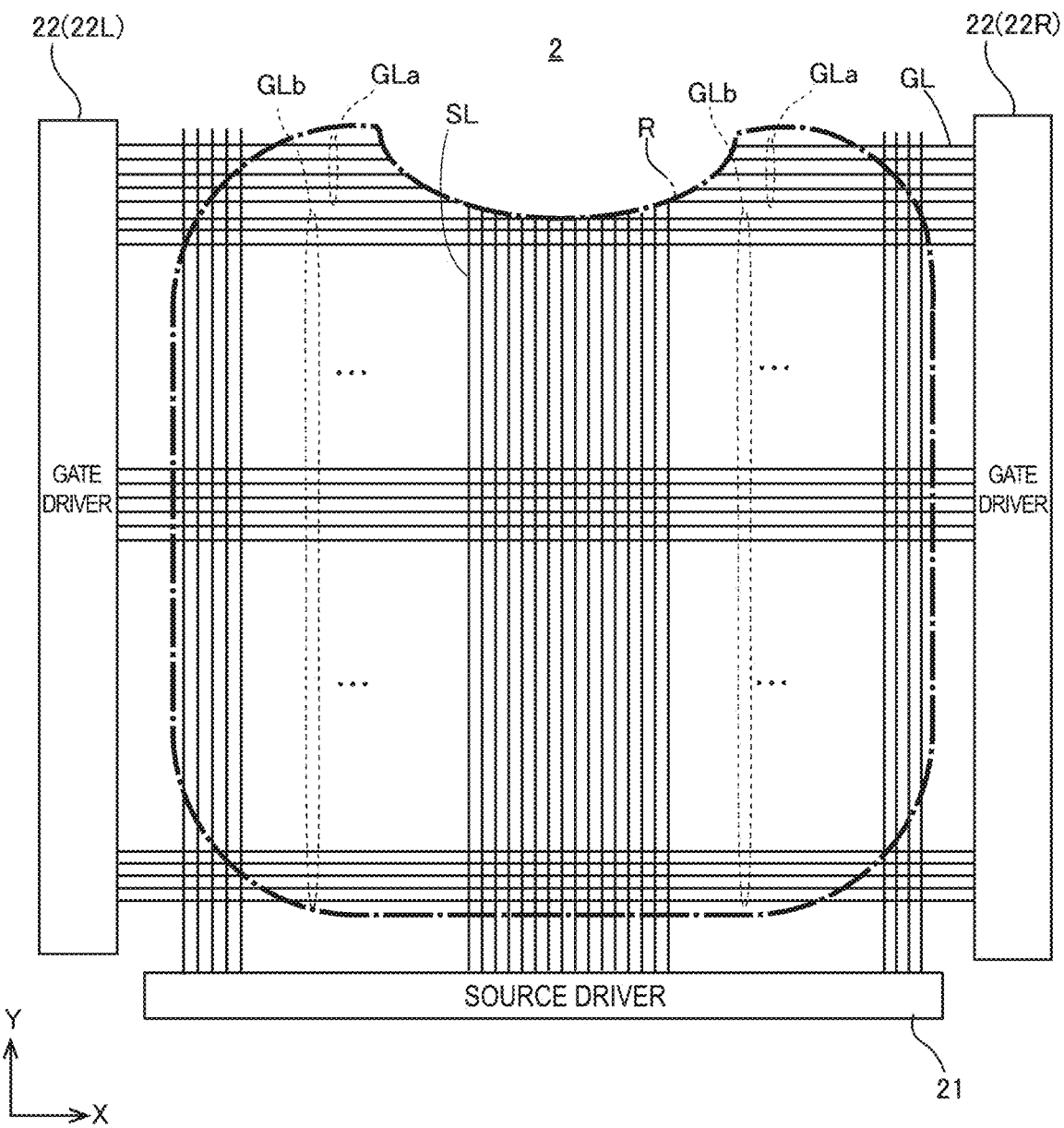
FIG. 2 is a plan view illustrating a schematic configuration of an active matrix substrate illustrated in FIG. 1.

FIG. 2 is a plan view illustrating a schematic configuration of the active matrix substrate 2. As illustrated in FIG. 2, the active matrix substrate 2 includes a plurality of gate lines GL and a plurality of source lines SL. In this example, a portion of the gate lines GL disposed on the Y-axis positive direction side in FIG. 2 are disposed so as to be separated in the X-axis direction. Hereinafter, this portion of the gate lines GL are referred to as gate lines GLa, and other gate lines GL other than the gate lines GLa are referred to as gate lines GLb.

The plurality of source lines SL intersect with the plurality of gate lines GL. The active matrix substrate 2 has a display region R constituted by pixels defined by the plurality of source lines SL and the plurality of gate lines GL. Hereinafter, the pixels are referred to as pixels PIX. In this example, the display region R has a non-rectangular shape with four arcuate corners, and the side in the Y-axis positive direction curved toward the Y-axis negative direction side. Hereinafter, the portion of the side curved toward the Y-axis negative direction side may be referred to as a curved portion.

The active matrix substrate 2 includes a source driver 21 in a frame region on the Y-axis negative direction side with respect to the display region R, and gate drivers 22L and 22R in a frame region on the X-axis positive and negative direction sides with respect to the display region R.

The gate driver 22L is connected to the plurality of gate lines GLb and to the left end of the plurality of gate lines GLa on the left side (X-axis negative direction side) of the curved portion. The gate driver 22R is connected to the plurality of gate lines GLb and to the right end of the plurality of gate lines GLa on the right side (X-axis positive direction side) of the curved portion. The gate drivers 22L and 22R are connected to a control circuit not illustrated. The gate drivers 22L and 22R sequentially scan the gate lines GL in the display region R synchronously with each other, based on control signals from the control circuit.

The source driver 21 is connected to the plurality of source lines SL. The source driver 21 is connected to the control circuit (not illustrated). The source driver 21 supplies a data voltage signal indicative of a gray scale of the image to each source line SL, based on a control signal from the control circuit.

The control circuit (not illustrated) supplies a control signal such as a synchronization signal (vertical synchronization signal, horizontal synchronization signal) indicating timing for writing an image to each pixel, and a clock signal for driving the source driver 21 and the gate drivers 22, to the gate drivers 22, depending on the frame rate.

Figure 3:
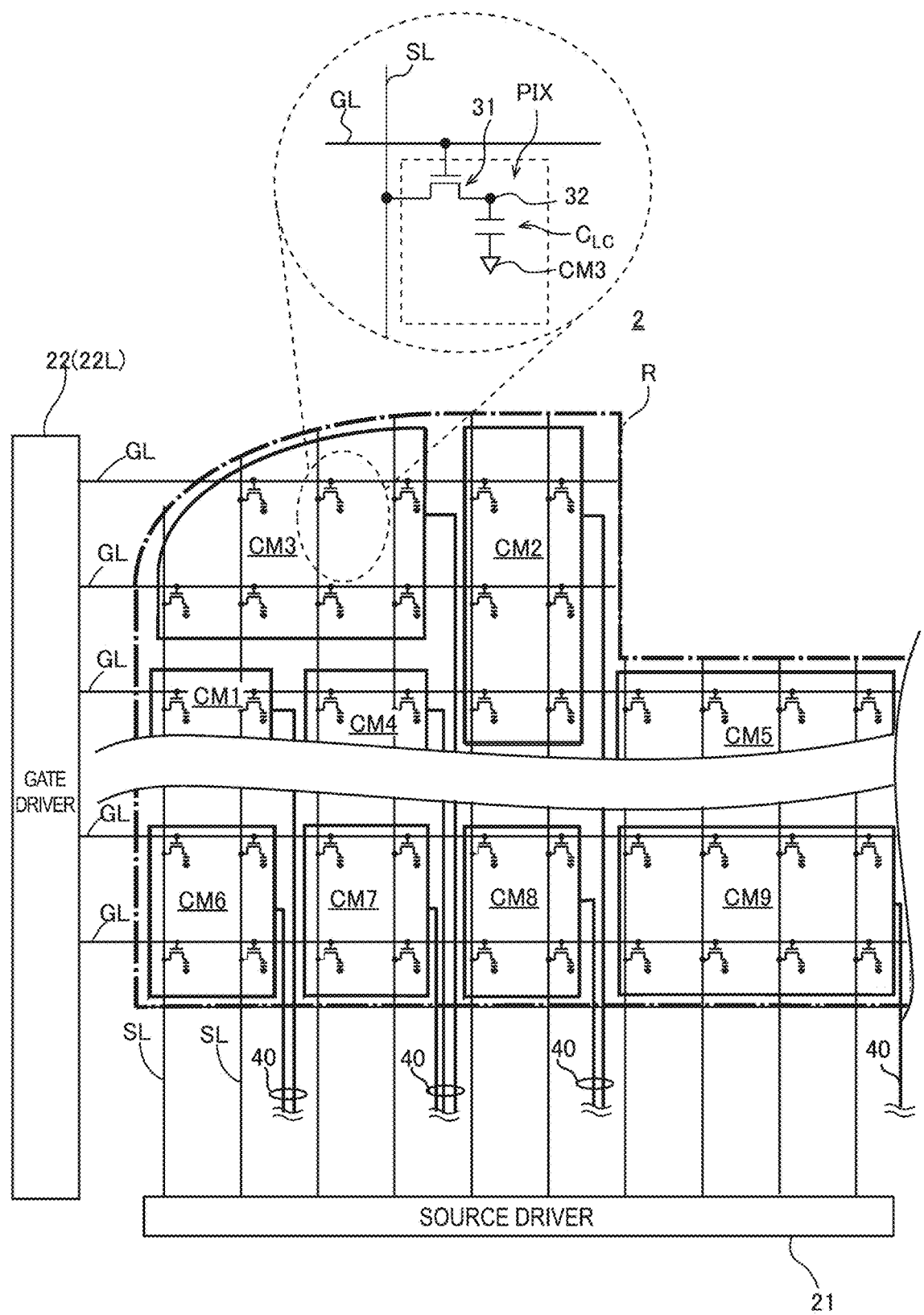
FIG. 3 is an enlarged view of a portion of the active matrix substrate illustrated in FIG. 2.

Next, the configuration of the pixels and the counter electrodes (common electrodes) will be described. FIG. 3 is an enlarged view of a portion of the active matrix substrate 2 illustrated in FIG. 2.

As illustrated in FIG. 3, on the active matrix substrate 2, a plurality of pixels PIX defined by the gate lines GL and the source lines SL are formed, and M (M is a natural number equal to or greater than three) counter electrodes (common electrodes) CM1 to CM9, . . . are disposed so as to overlap with the pixels PIX in a plan view. Hereinafter, in a case where the counter electrodes are not differentiated, the counter electrodes are referred to as counter electrodes CM. The counter electrodes CM overlap a portion of the plurality of pixels PIX in the display region R in a plan view. The shapes and sizes of the counter electrodes CM are not uniform. Note that although not illustrated in this figure, a slit (for example, a few μm in width) is formed between the counter electrode CM and a pixel electrode 12 described below to produce a transverse electrical field.

The active matrix substrate 2 is provided with a plurality of sensor wiring lines (counter electrode wiring lines) 40 connected to the counter electrodes CM. Although not illustrated in this figure, in the active matrix substrate 2, a controller (control unit) 50 (see FIG. 4) is provided to control the potential of the counter electrodes CM in the frame region in which the source driver 21 is provided. The plurality of sensor wiring lines 40 are connected to the controller 50.

Each of the pixels PIX includes a Thin Film Transistor (TFT) 31 and a pixel electrode 32. In the TFT 31, the gate electrode is connected to the gate line GL, the source electrode is connected to the source line SL, and the drain electrode is connected to the pixel electrode 32. A liquid crystal capacitance C is formed between the pixel electrode 32 in the pixel PIX and the counter electrode CM that overlaps with the pixel electrode 32 in a plan view. The pixel PIX overlaps in a plan view with any of the R, G, and B LC color filters (not illustrated) provided on the counter substrate 3 (see FIG. 1).

In a case of displaying an image in the display region R, the controller 50 (see FIG. 4) applies a predetermined common voltage to the M counter electrodes CM via the plurality of sensor wiring lines 40. In a case of detecting the touch position, the controller 50 applies a touch drive voltage to the plurality of counter electrodes CM via the plurality of sensor wiring lines 40. The touch drive voltage is a voltage that varies periodically in voltage levels between High (H) level and Low (L) level. The controller 50 applies an inspection voltage to the counter electrodes CM via the sensor wiring lines 40, and detects the presence or absence of a short-circuit of the counter electrodes CM. A specific example of the inspection voltage will be described later.

For example, the detection of the touch position is performed as follows. A parasitic capacitance is formed between adjacent counter electrodes CM. In a case where a person's finger or the like touches the display screen of the display device 1, capacitance is formed between the person's finger or the like and the common electrode CM, and the electrostatic capacitance increases. The change in the electrostatic capacitance at the position of the counter electrode CM is output to the controller 50 (see FIG. 4) via the sensor wiring lines 40. The touched position is detected based on the change in the electrostatic capacitance at each counter electrode CM output to the controller 50.

Figure 4:
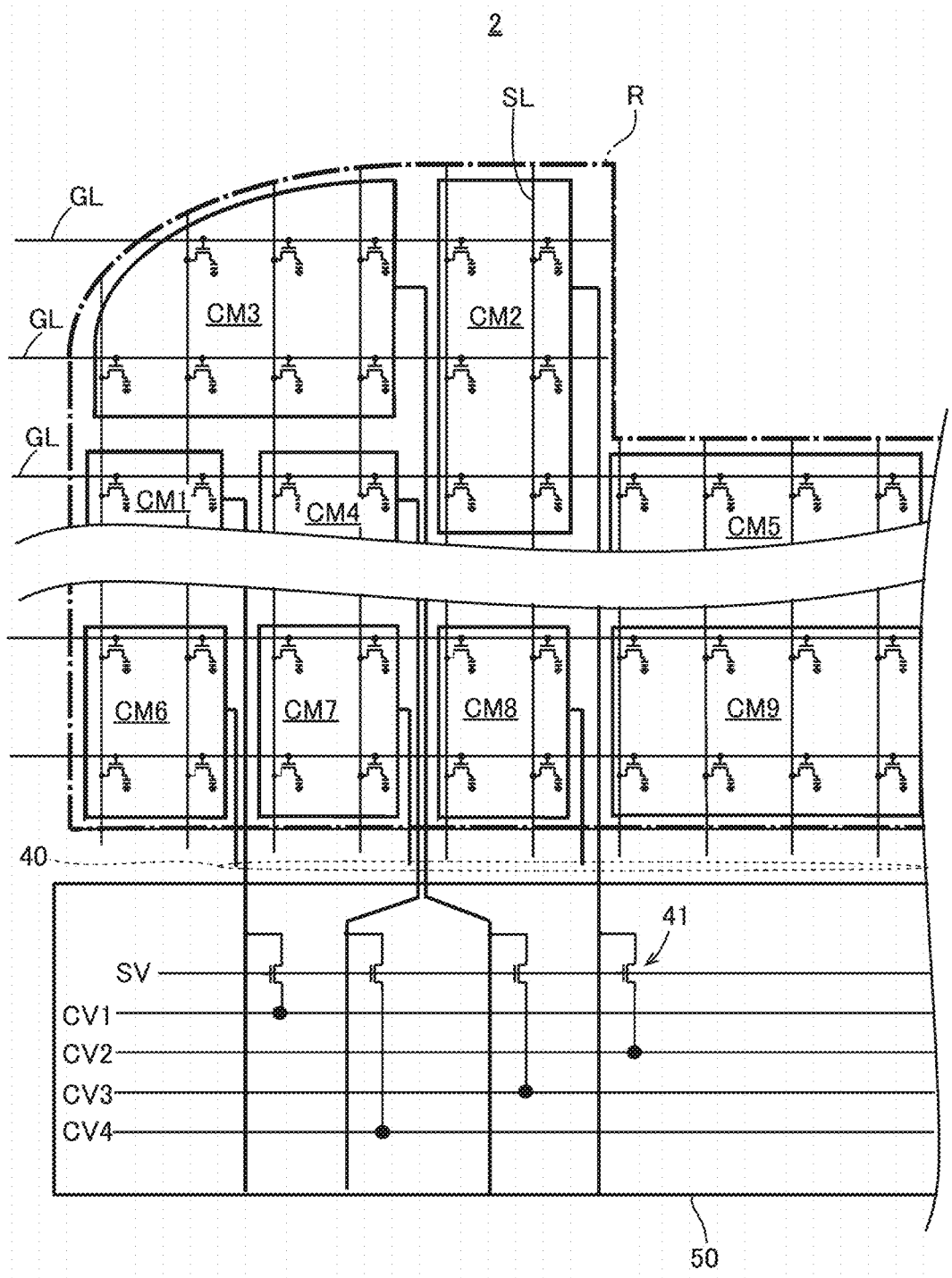
FIG. 4 is a schematic view illustrating a connection relationship between a controller and sensor wiring lines.

Here, the connection between the controller 50 and the sensor wiring lines 40 will be described with reference to FIG. 4. FIG. 4 is a schematic view illustrating an example of the connection between the controller 50 and the sensor wiring lines 40.

The controller 50 includes a switching element 41 provided for each of the sensor wiring lines 40, common voltage wiring lines CV1 to CV4, a control voltage wiring line SV for switching on/off of each of the switching elements 41, and a control circuit not illustrated. Hereinafter, in a case where the common voltage wiring lines CV1 to CV4 are not differentiated, the common voltage wiring lines are referred to as common voltage wiring lines CV.

In a case where an image is displayed in the display region R, the common voltage wiring lines CV1 to CV4 are applied with the common voltage by the control circuit, and in a case where the touch position is detected, the common voltage wiring lines CV1 to CV4 are applied with the touch drive voltage by the control circuit. In a case where the presence or absence of a short-circuit of the counter electrodes CM is detected, each of the common voltage wiring lines CV1 to CV4 is applied with the inspection voltage by the control circuit.

Each of the sensor wiring lines 40 is extended to the controller 50 and is connected to one switching element 41 in the controller 50. For convenience, in FIG. 4, only some of the sensor wiring lines 40 are depicted as the sensor wiring lines 40 extended to the controller 50, but in actual configuration, all of the sensor wiring lines 40 are extended to the controller 50, and each is connected to one switching element 41.

The switching element 41 is, for example, an n-Channel Metal-Oxide Semiconductor (n-channel MOS) transistor. The gate of the switching element 41 is connected to the control voltage wiring line SV, the drain is connected to the sensor wiring line 40, and the source is connected to the common voltage wiring line CV.

Each of the sensor wiring lines 40 is connected to any of the common voltage wiring lines CV1 to CV4 via the switching element 41 connected to the sensor wiring line 40. Hereinafter, a more specific description will be made with reference to FIGS. 5A and 5B.

Figure 5A:
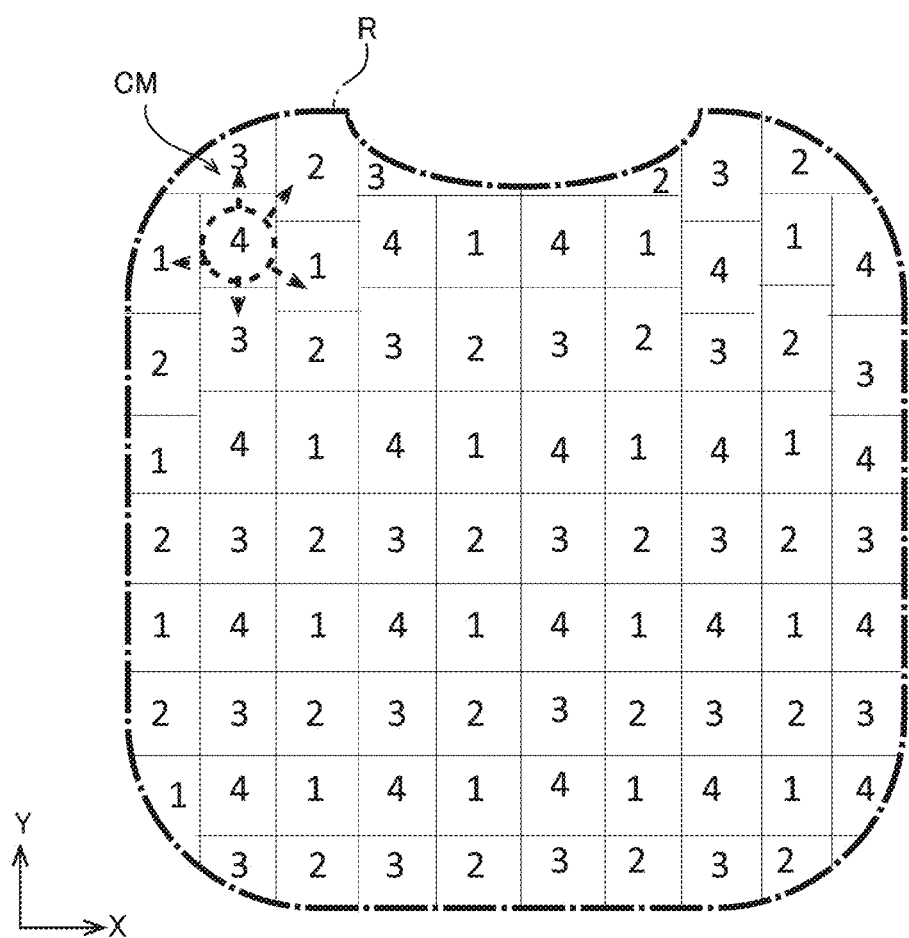
FIG. 5A is a schematic view illustrating common voltage wiring lines to which sensor wiring lines are connected.

FIG. 5A is a schematic view illustrating common voltage wiring lines CV to which each of the sensor wiring lines 40 of each of the counter electrodes CM is connected. In FIG. 5A, each of the frames separated by thin lines indicates each of the counter electrodes CM. The numbers "1 to 4" within the frames correspond to each of the common voltage wiring lines CV1 to CV4 to which the sensor wiring line 40 of the counter electrode CM is connected. In other words, the sensor wiring line 40 of the counter electrode CM having "1" is connected to the common voltage wiring line CV1, and the sensor wiring line 40 of the counter electrode CM having "2" is connected to the common voltage wiring line CV2. Similarly, the sensor wiring lines 40 of the counter electrodes CM having "3" and the counter electrodes CM having "4" are respectively connected to the common voltage wiring lines CV3 and CV4.

The common voltage wiring lines CV to which the sensor wiring lines 40 of the counter electrodes CM are connected are different from the sensor wiring lines 40 of the adjacent counter electrodes CM. Here, as an example, a common voltage wiring line CV to which a counter electrode CM having "4" indicated by the dashed line frame in FIG. 5A is connected and common voltage wiring lines CV to which five counter electrodes CM indicated by dashed arrows adjacent to the counter electrode CM are connected will be described. The sensor wiring line 40 of the counter electrode CM indicated by the dashed line frame is connected to the common voltage wiring line CV4. Each of the sensor wiring lines 40 of the five counter electrodes CM adjacent to the counter electrode CM is connected to any of the other common voltage wiring lines CV1 to CV3 other than the common voltage wiring line CV4.

Figure 5B:
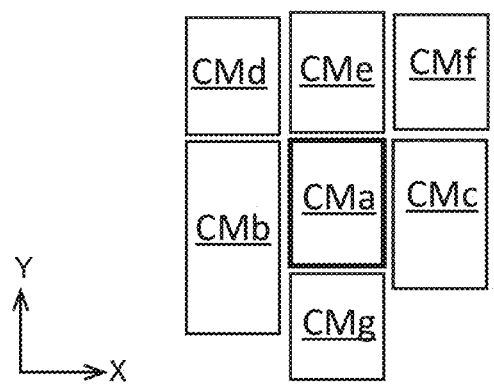
FIG. 5B is a schematic view for illustrating an example of counter electrodes adjacent to one counter electrode.

Note that in the present specification, "adjacent" is a state in which at least a portion of one side of the counter electrode CM faces one side of another counter electrode CM in the X-axis direction or the Y-axis direction. With reference to FIG. 5B, a specific example of adjacent counter electrodes will be described. FIG. 5B is a schematic view illustrating an arrangement example of counter electrodes CM. In FIG. 5B, each side of the counter electrode CMa faces one side of each of the counter electrodes CMb, CMc, CMe, and CMg in the X-axis direction or the Y-axis direction. On the other hand, either side of the counter electrode CMa does not face a side of the counter electrode CMd and the counter electrode CMf. Thus, the counter electrodes adjacent to the counter electrode CMa are the counter electrodes CMb, CMc, CMe, and CMg, and the counter electrodes CMd and CMf are not adjacent to the counter electrode CMa.

In the manufacturing process of the active matrix substrate 2, in a case of inspecting the presence or absence of short-circuit defects in the counter electrodes CM, a control voltage that turns on the switching elements 41 (see FIG. 4) is applied to the control voltage wiring line SV by the control circuit (not illustrated). As a result, each of the sensor wiring lines 40 is connected to a corresponding common voltage wiring line CV via the switching elements 41. In the short-circuit inspection of the counter electrodes CM, an inspection voltage different from other common voltage wiring lines CV is applied to each of the common voltage wiring lines CV1 to CV4 by the control circuit (not illustrated), and a current in each of the common voltage wiring lines CV is detected.

Figure 6A:
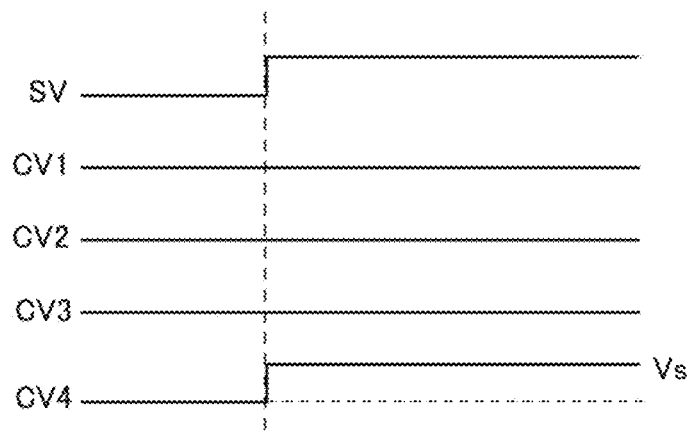
FIG. 6A is a waveform diagram illustrating the potential changes of the control voltage wiring line and the common voltage wiring lines in a case of inspecting short-circuits of the counter electrodes.

FIG. 6A is a waveform diagram illustrating the potential changes of the control voltage wiring line SV and the common voltage wiring lines CV1 to CV4 in a case of inspecting short-circuits of the counter electrodes CM. In this example, the counter electrodes CM connected to the common voltage wiring line CV4 are subject to the short-circuit inspection.

In FIG. 6A, in a case where a voltage at an H level corresponding to the on voltage of the switching elements 41 is applied to the control voltage wiring line SV, an inspection voltage Vs (first voltage) is applied to the common voltage wiring line CV4. Predetermined common voltages (second voltages) such as 0 v are configured for the other common voltage wiring lines CV1 to CV3.

Figure 6B:
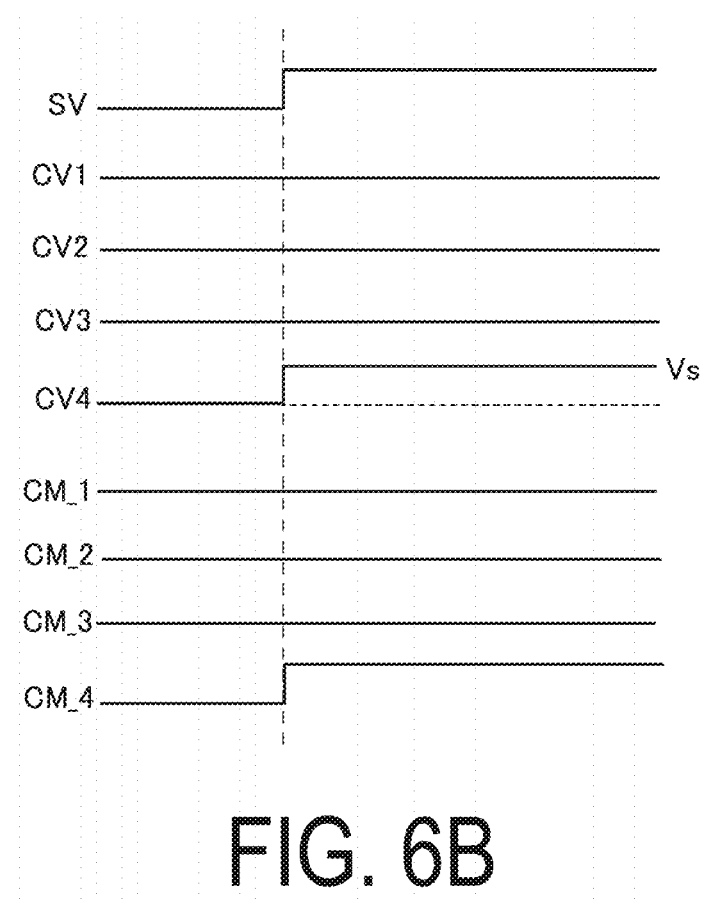
FIG. 6B is a waveform diagram illustrating the potential changes in an inspection step of some of the counter electrodes connected to each of the common voltage wiring lines.

FIG. 6B is a waveform diagram illustrating the potential changes of the counter electrodes CM connected to each of the common voltage wiring lines CV1 to CV4. The counter electrodes CM connected to each of the common voltage wiring lines CV1 to CV4 is referred to below as counter electrodes CM_1 to CM_4.

In a case where the counter electrode CM_4 is not shorted to other adjacent counter electrodes CM_1 to CM_3, the potential of the counter electrode CM_4 is the same potential as the common voltage wiring line CV4. The potential of each of the other counter electrodes CM_1 to CM_3 is also the same potential as the common voltage wiring lines CV1 to CV3. In this case, little current flows to each of the common voltage wiring lines CV1 to CV4.

Figure 6C:
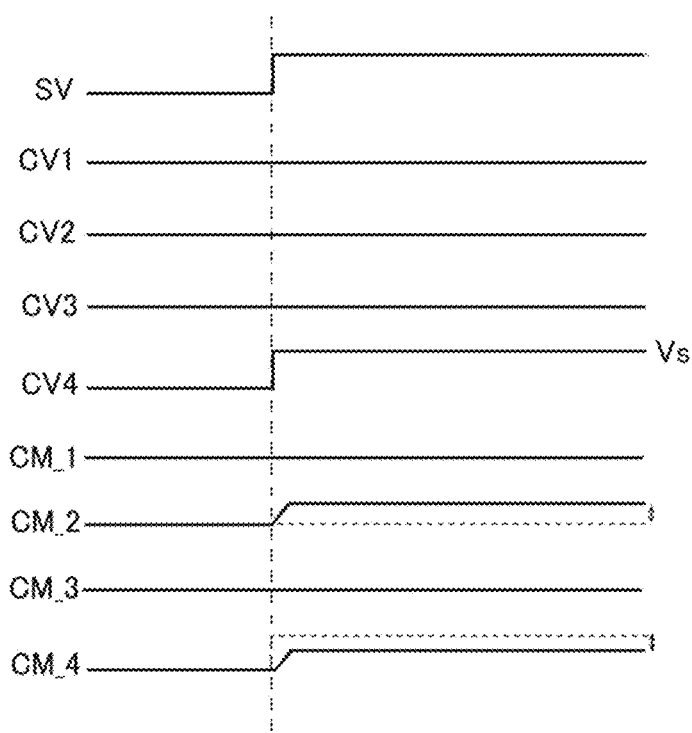
FIG. 6C is a waveform diagram illustrating the potential changes of the common voltage wiring lines in an inspection step in a case where counter electrodes are shorted.

On the other hand, for example, in a case where the counter electrode CM_4 and the counter electrode CM_2 are shorted, current flows between the common voltage wiring line CV2 and the common voltage wiring line CV4 due to shorting of the counter electrode CM_4 and the counter electrode CM_2. In other words, as illustrated in FIG. 6C, the potentials of the counter electrode CM_4 and the counter electrode CM_2 are different from the original potentials indicated by the broken lines, that is, the intermediate potential between the common voltage wiring line CV4 and the common voltage wiring line CV2, and current flows between the common voltage wiring line CV4 and the common voltage wiring line CV2 via the shorted counter electrodes CM_4 and CM_2. In the control circuit (not illustrated), by detecting the current in the common voltage wiring lines CV1 to CV4, it is detected that the inspection target electrode CM_4 is shorted to the counter electrode CM_2.

In the example described above, an example has been described in which an inspection voltage is applied to the common voltage wiring line CV4, but as described above, the inspection voltage Vs is sequentially applied by the control circuit (not illustrated) in the same manner as described above in the common voltage wiring lines CV1 to CV3. Then, by detecting the current in the common voltage wiring lines CV1 to CV4 by the control circuit (not illustrated) in a case where the inspection voltage Vs is applied, it is detected whether or not the counter electrodes CM are shorted.

According to the configuration of the present embodiment, the luminance unevenness in a case of displaying a specific pattern image is also reduced. Here, luminance unevenness generated in a case where a specific pattern image is displayed will be described.

In a case of writing image data to the display region R, a data voltage of mutually different polarities may be applied to the adjacent source lines SL, and column inversion driving may be performed in which the polarity of the data voltage applied to the source line SL is inversed for each frame. In a case where a specific pattern image is displayed in the display region R by column inversion driving, luminance unevenness tends to occur in a case where there is variation in the parasitic capacitances of the counter electrodes CM.

Figure 7A:
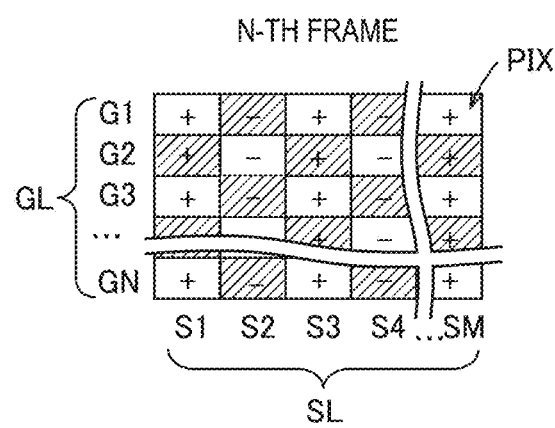
FIG. 7A is a schematic view illustrating a state of pixels in the N-th frame corresponding to a pattern image according to the first embodiment.
Figure 7B:
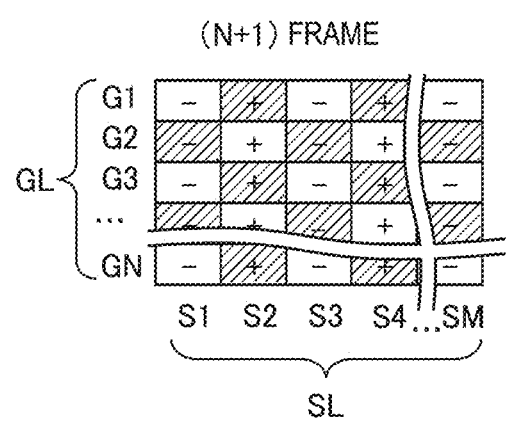
FIG. 7B is a schematic view illustrating a state of pixels in the N+1-th frame corresponding to the same pattern image as in FIG. 7A.

FIGS. 7A and 7B are schematic views illustrating pattern images that tend to generate luminance unevenness in a case where image data is written by column inversion driving. FIG. 7A represents a state of pixels in the N-th frame, and FIG. 7B illustrates a state of pixels in the N+1-th frame. The "+" or "−" in the pixels PIX in FIGS. 7A and 7B indicates the polarity of the data voltage. FIGS. 7A and 7B illustrate that the hatched pixels PIX display an image of black color (minimum gray scale value), and the unhatched pixels PIX display an image of white color (maximum gray scale value). The pattern image in this example is an image in which black images and white images are arranged in a staggered lattice pattern.

Figure 8A:
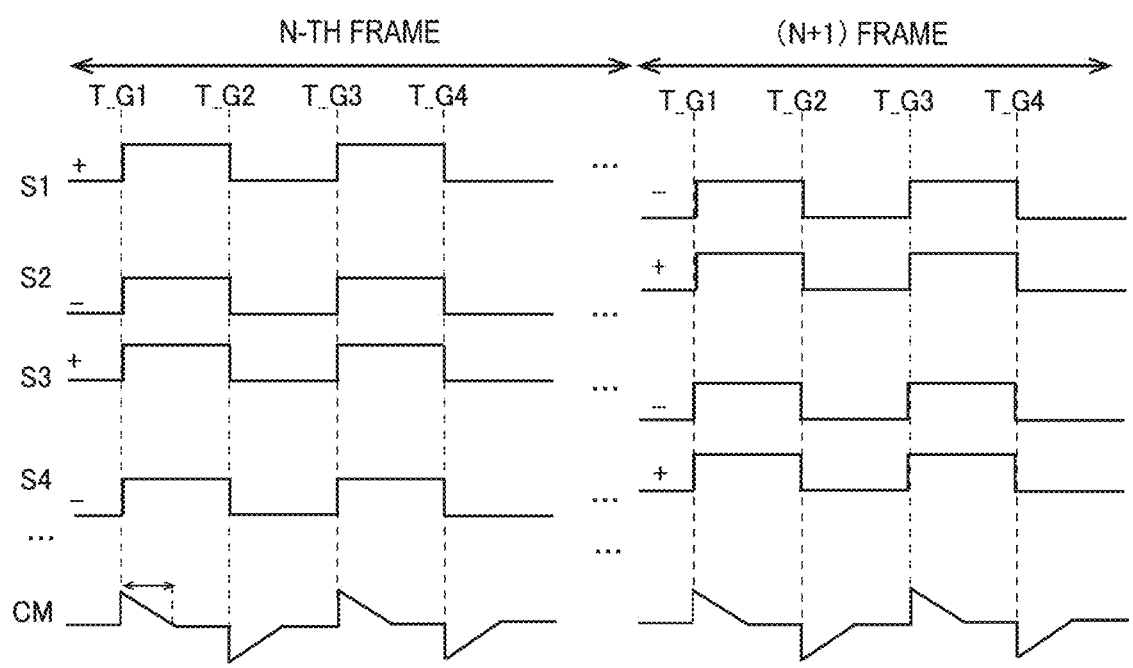
FIG. 8A is a waveform diagram illustrating the data voltages corresponding to the state of the pixels illustrated in FIGS. 7A and 7B, and the potentials of the counter electrodes according to the first embodiment.
Figure 8B:
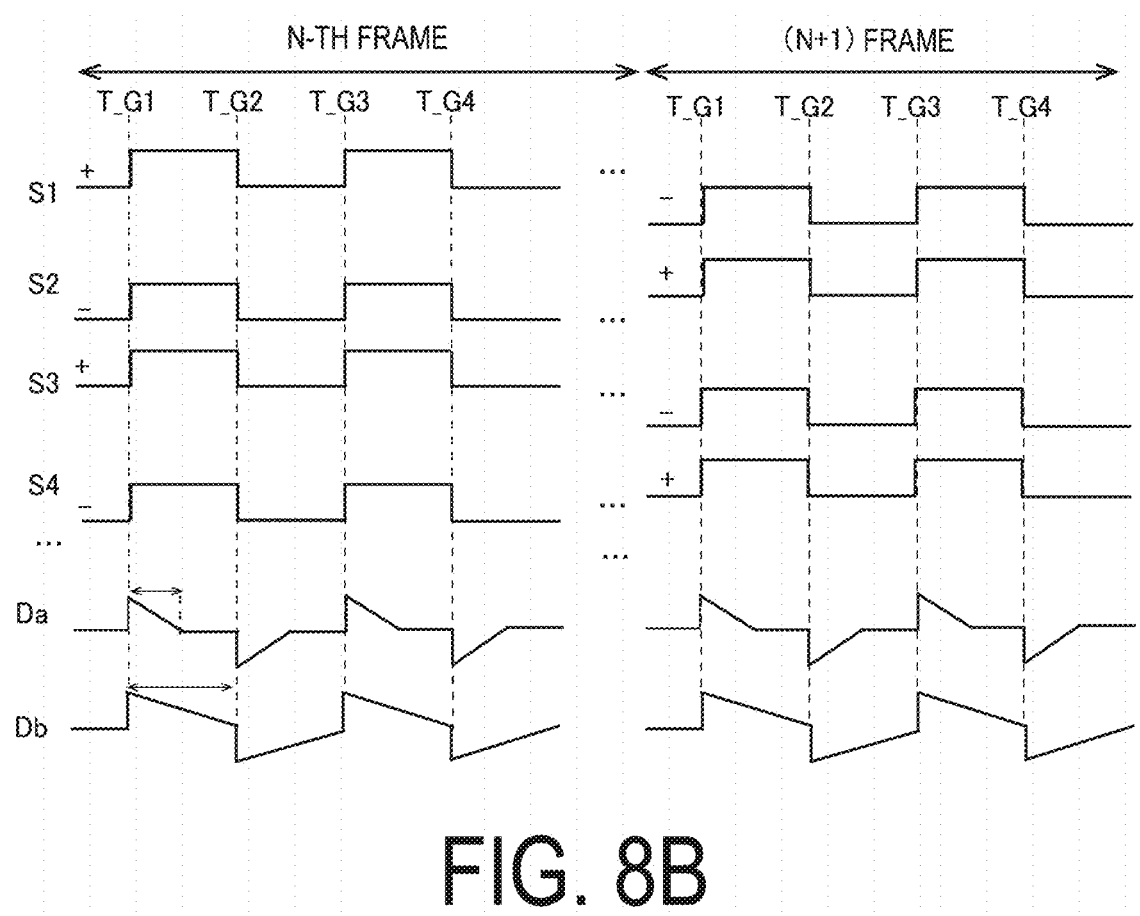
FIG. 8B is a waveform diagram illustrating the potentials of the counter electrodes in a case where the parasitic capacitances of the counter electrodes are not equalized, as the comparative example of FIG. 8A.

FIGS. 8A and 8B are waveform diagrams illustrating the data voltages corresponding to the states of the pixels illustrated in FIGS. 7A and 7B, and the potentials of the counter electrodes. In FIGS. 8A and 8B, each of T_G1 to T_G4 indicates the timing at which the gate lines GL arranged in rows G1 to G4 illustrated in FIGS. 7A and 7B are scanned. Each of the S1 to S4 indicates the potential of the source lines SL disposed in columns S1 to S4.

As illustrated in FIGS. 8A and 8B, the potential of the source line SL varies depending on the polarity of the data voltage applied to the source line SL and the gray scale value of the image to be written to the pixel PIX. For example, in the N-th frame, the source line SL of the column S1 is applied with a data voltage corresponding to the maximum gray scale value of the positive polarity at the timing T_G1, and is applied with a data voltage corresponding to the minimum gray scale value of the positive polarity at the timing T_G2. The source line SL of the column S2 is applied with a data voltage corresponding to the minimum gray scale value of the negative polarity at the timing T_G1 in the N-th frame, and is applied with a data voltage corresponding to the maximum gray scale value of the negative polarity at the timing T_G2. The source lines SL in the other columns S3, S4, . . . are similarly applied with a data voltage corresponding to the maximum or minimum gray scale value of the positive or negative polarity each time the gate line GL is scanned.

In a case where the pattern image is displayed, the same common voltage is applied to all the counter electrodes CM. The potential of the counter electrode CM is influenced by the potential variation of the source line SL in the pixel PIX overlapping in a plan view with the counter electrode CM. In other words, the potential of the counter electrode CM becomes higher than the original potential in a case where the potential of the source line SL of the pixel PIX overlapping in a plan view increases, and becomes lower than the original potential in a case where the potential of the source line SL decreases. Thereafter, the potential of the counter electrode CM begins to return to its original potential.

In the present embodiment, adjacent counter electrodes CM are connected to mutually different common voltage wiring lines CV. Thus, in a case where the adjacent counter electrodes CM are not shorted, parasitic capacitance occurs between the adjacent counter electrodes CM. In other words, the parasitic capacitances of the counter electrodes CM for each of the common voltage wiring lines CV are equalized. Therefore, in a case where the above-described pattern image is displayed by the column inversion driving, the times until the counter electrodes CM return to the original potentials are the same, and luminance unevenness due to the difference in the parasitic capacitances is less likely to occur.

In contrast, in a case where the parasitic capacitances of the counter electrodes for each of the common voltage wiring lines CV are not equalized, luminance unevenness occurs because the times until the counter electrodes return to the original potentials vary. That is, in a case where a region where counter electrodes CM connected to the same common voltage wiring line CV are adjacent to each other and a region where adjacent counter electrodes CM are connected to common voltage wiring lines CV different from each other are mixed, such luminance unevenness tends to occur.

As described above, in a case where adjacent counter electrodes CM are connected to common voltage wiring lines CV different from each other as in the present embodiment, parasitic capacitances occur between each adjacent counter electrodes CM. On the other hand, in a case where counter electrodes connected to the same common voltage wiring line are adjacent to each other, the counter electrodes are at the same potential, so parasitic capacitances that would otherwise occur do not occur between these counter electrodes. As a result, the parasitic capacitances of the counter electrodes vary for each of the common voltage wiring lines.

FIG. 8B is a waveform diagram illustrating the potential changes of the counter electrodes having different parasitic capacitances in a case where the above pattern image is displayed by the column inversion driving as a comparative example. In FIG. 8B, "Da" and "Db" are counter electrodes having parasitic capacitances different from each other, and the parasitic capacitance of the counter electrode Da is smaller than the parasitic capacitance of the counter electrode Db. Because the parasitic capacitance of the counter electrode Db is greater than that of the counter electrode Da, the potential of the counter electrode Db is less likely to return to the original potential than the counter electrode Da. As a result, the pixels in the region where the counter electrode Db is provided are displayed darker than the pixels in the region where the counter electrode Da is provided, and luminance unevenness occurs in the display region.

Second Embodiment

Figure 9:
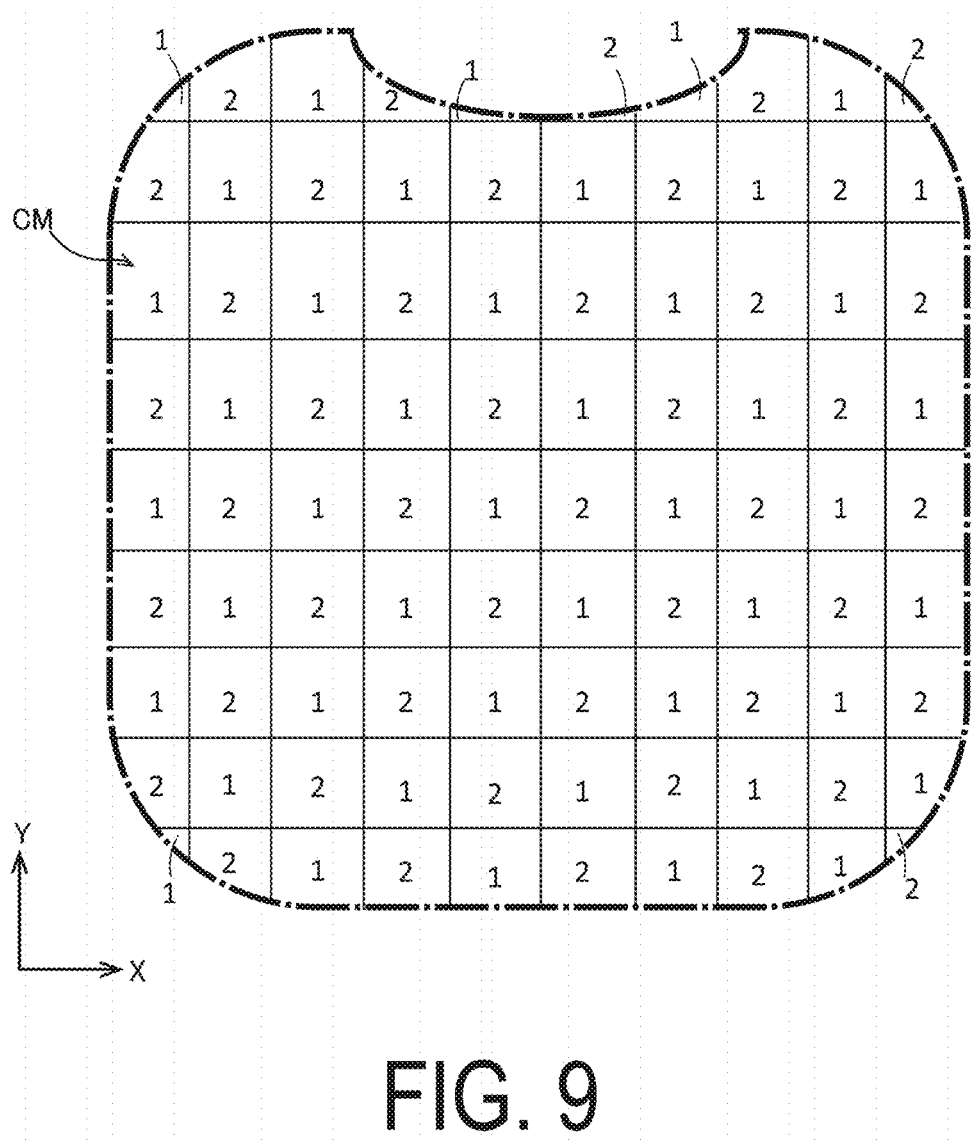
FIG. 9 is a schematic view illustrating an example of the connection between the counter electrodes and the common voltage wiring lines according to a second embodiment.

In the first embodiment described above, an example has been described in which four common voltage wiring lines CV are provided, but it is sufficient that at least two common voltage wiring lines CV be provided. An example of such an arrangement of the counter electrodes CM is illustrated in FIG. 9. As illustrated in FIG. 9, the display region R of the present embodiment has the same shape as that of the first embodiment, but the arrangement of the counter electrodes CM provided in the display region R is different from that of the first embodiment. Specifically, in the example of FIG. 9, the shapes and sizes of the counter electrodes CM are not uniform in the same manner as in the first embodiment, but the counter electrodes CM are aligned in a matrix shape. That is, the lengths in the Y-axis direction of the counter electrodes CM aligned in the X-axis direction are uniform, and the lengths in the X-axis direction of the counter electrodes CM aligned in the Y-axis direction are uniform. In this case, there is one other counter electrode CM facing each side of the counter electrodes CM. That is, there is one other counter electrode CM that is adjacent to each side of the counter electrodes CM.

Note that, although not illustrated in FIG. 9, the sensor wiring lines 40 are connected to each of the counter electrodes CM, similar to the first embodiment. The sensor wiring line 40 of each of the counter electrode CM is connected to a common voltage wiring line CV different from the sensor wiring lines 40 of the adjacent counter electrodes CM. The numbers "1" and "2" within the thin line frame in FIG. 9 represent the common voltage wiring lines CV to which the counter electrode CM is connected. In this example, the counter electrode CM is connected to one of the common voltage wiring lines CV1 and CV2 via the sensor wiring line 40.

In the present embodiment, similar to the first embodiment, the inspection voltage is applied for each of the common voltage wiring lines CV, and the current in the common voltage wiring lines CV is detected to detect whether or not the counter electrodes CM are shorted. Each of the counter electrodes CM is connected to a common voltage wiring line CV different from the adjacent counter electrodes CM. Thus, the parasitic capacitances of the counter electrodes CM connected to each of the common voltage wiring lines CV are equalized, and even in a case where the pattern image described above is displayed by the column inversion driving, luminance unevenness does not easily occur. As in the present embodiment, in a case where there is one other counter electrode CM that is adjacent to each side of the counter electrodes CM, it is sufficient that two types of common voltage wiring lines be provided. That is, the number of counter electrodes CM adjacent to one counter electrode CM is reduced compared to a case where there are a plurality of adjacent counter electrodes CM on each side of the counter electrodes CM as in the first embodiment. As a result, the number of common voltage wiring lines CV connected to the counter electrodes CM can be reduced compared to the configuration of the first embodiment.

Embodiments of the disclosure have been described above, but the embodiments described above are merely examples for implementing the disclosure. Thus, the disclosure is not limited to the embodiments described above, and can be carried out by appropriately modifying the embodiments described above without departing from the scope. Now, modified examples of the above-described embodiments are given.

(1) In the embodiments described above, in a case of inspecting short-circuits of the counter electrodes CM, the gate lines GL and the source lines SL may be driven. In other words, the gate lines GL are sequentially scanned by the gate drivers 22L and 22R, and a data voltage corresponding to the pattern image described above, for example, is applied to each of the source lines SL. Then, similar to the above-described embodiments, the inspection voltage Vs is applied for each of the common voltage wiring lines CV. For example, at the time at which the inspection voltage is applied to the common voltage wiring line CV4, in a case where the counter electrodes CM_4 is not shorted, the pixel areas in the counter electrodes CM_4 connected to the common voltage wiring line CV4 provide substantially the same display, and provide different display from the pixel areas of the counter electrodes connected to the other common voltage wiring lines CV1 to CV3. On the other hand, in a case where a counter electrode CM_4 and a counter electrode CM_2 are shorted, the pixel areas provided with the shorted counter electrodes CM_4 and CM_2 provide different display from the pixel areas of the other counter electrodes CM_2 and CM_4 connected to the common voltage wiring lines CV2 and CV4. In this way, whether or not the counter electrode CM is shorted may be detected by the luminance of the displayed image.

(2) In the embodiments described above, an example has been described in which the sensor wiring lines 40 and the common voltage wiring lines CV are connected via the switching elements 41, but the sensor wiring lines 40 and the common voltage wiring lines CV may be directly connected. According to this configuration, the switching elements 41 are not provided on the active matrix substrate 2, so the frame narrowing of the active matrix substrate 2 is achieved.

(3) In the embodiments described above, an example has been described in which short-circuit defects of the counter electrodes CM are detected by using the common voltage wiring lines CV provided on the active matrix substrate 2, but the configuration for inspecting short-circuit defects is not limited thereto. For example, an inspection substrate having common voltage wiring lines for inspection formed on the outer side of the active matrix substrate 2 may be arranged, and the sensor wiring lines 40 connected to some adjacent counter electrodes CM may be connected to the common voltage wiring lines for inspection. The connection relationship between the sensor wiring lines 40 and the common voltage wiring lines for inspection is the same as the embodiments described above. That is, the sensor wiring lines 40 of adjacent counter electrodes CM are connected to common voltage wiring lines for inspection different from each other. In this case as well, similar to the embodiments described above, an inspection voltage is applied to each of the common voltage wiring lines for inspection, and a current in each of the common voltage wiring lines for inspection is detected. As a result, whether or not a short-circuit of the counter electrodes CM occurs in some of the counter electrodes CM is detected. After the short-circuit defect inspection is completed, the inspection substrate may be separated from the active matrix substrate 2.

Figure 10A:
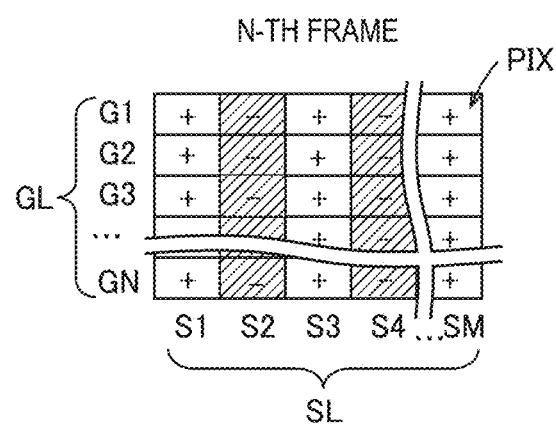
FIG. 10A is a schematic view illustrating a state of pixels in the N-th frame corresponding to a pattern image according to a fourth modified example.
Figure 10B:
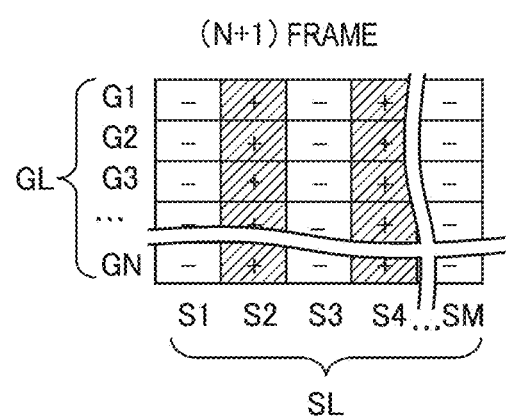
FIG. 10B is a schematic view illustrating a state of pixels in the N+1-th frame corresponding to the same pattern image as in FIG. 10A.

(4) In the embodiments described above, the images illustrated in FIGS. 7A and 7B has been described as pattern images that tend to generate luminance unevenness as an example, but pattern images prone to luminance unevenness are not limited thereto. FIGS. 10A and 10B are schematic views illustrating other pattern images. FIG. 10A illustrates a state of pixels in the N-th frame, and FIG. 10B illustrates a state of pixels in the N+1-th frame. The "+" or "−" in the pixels PIX in FIGS. 10A and 10B indicates the polarity of the data voltage. FIGS. 10A and 10B illustrate that the hatched pixels PIX display an image of black color (minimum gray scale value), and the unhatched pixels PIX display an image of white color (maximum gray scale value). That is, these pattern images display the same color (black or white) image for the same column of pixels, and the pixels in adjacent columns display images of different colors from each other.

Figure 10C:
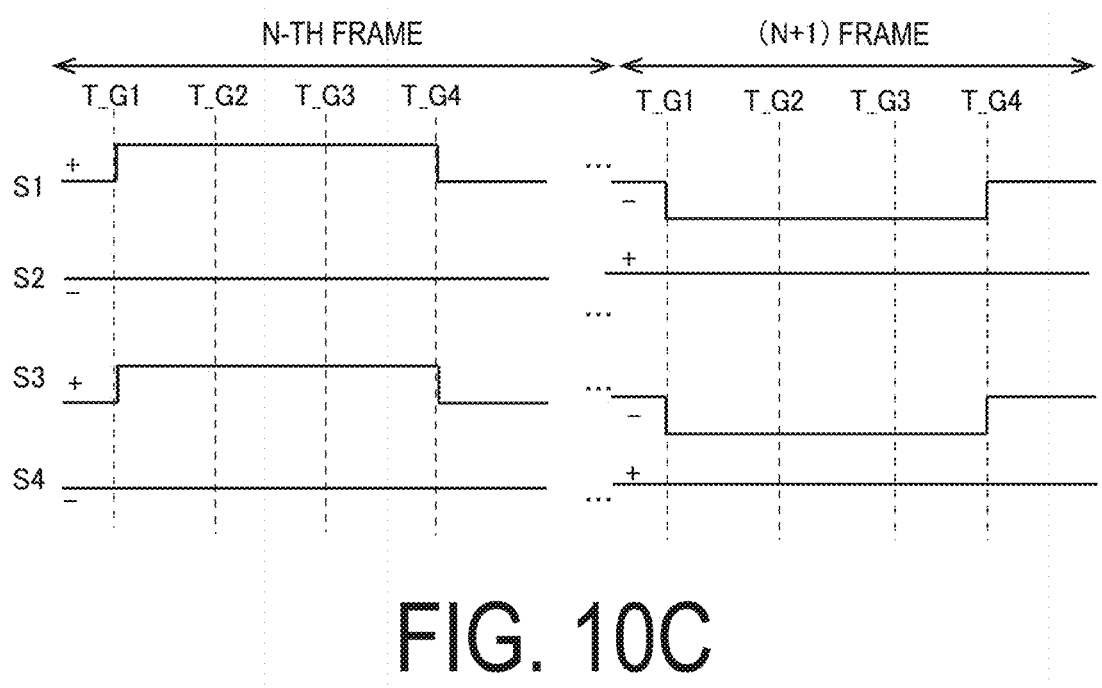
FIG. 10C is a waveform diagram illustrating changes in data voltage corresponding to the pattern images of FIGS. 10A and 10B.

FIG. 10C is a waveform diagram illustrating changes in data voltage applied to the source lines SL in a case of displaying the pattern images of FIGS. 10A and 10B. The data voltage illustrated in FIG. 10C illustrates a case in which the driving of the liquid crystal is a normally black.

In this example, the pixels defined by the gate lines GL in the row G1 and the source lines SL in each of the columns S1 and S3 are applied with the maximum gray scale voltage of the positive polarity applied in the N-th frame, and are applied with the maximum gray scale voltage of the negative polarity in the next N+1-th frame. As a result, negative potential variation occurs in the counter electrodes CM. On the other hand, the pixels defined by the gate lines GL in the row G1 and the source lines SL in each of the columns S2 and S4 are applied with the minimum gray scale voltage of the negative polarity in the N-th frame, and are applied with the minimum gray scale voltage of the positive polarity in the next N+1-th frame. In this case, because the difference in the gray-scale voltage between the N-th frame and the N+1-th frame is small, the counter electrodes CM have little effect on the data voltage. As a result, the counter electrodes CM varies in potential on the negative side as a whole. The pixel areas overlapping the counter electrodes CM having the varied potential become luminance smaller than the original luminance due to the pixel potential becoming smaller, which causes luminance unevenness. With the configuration of the first embodiment described above, even in a case where such a pattern image is displayed, the parasitic capacitances of the counter electrodes CM for each of the common voltage wiring lines CV are equalized, so the luminance unevenness is reduced.

Figure 11A:
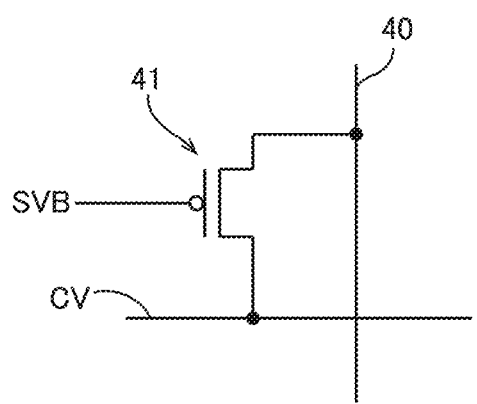
FIG. 11A is an equivalent circuit diagram illustrating a configuration example of switching elements according to a fifth modified example.
Figure 11B:
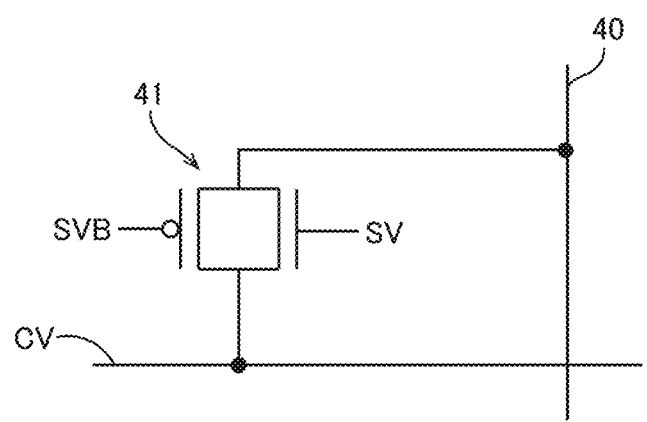
FIG. 11B is an equivalent circuit diagram illustrating a configuration example of switching elements different from those of FIG. 11A.

(5) In the embodiments described above, an example has been described in which n-type MOS transistors are used as the switching elements 41, but the switching elements 41 are not limited thereto. For example, the switching elements 41 may be composed of p-type MOS transistors or may be composed of Complementary MOS (CMOS) transistors that combine re-channel MOS transistors and p-channel MOS transistors. In a case where the CMOS transistors are used, at the time at which the potential of the counter electrodes CM fluctuates due to the potential variation of the source lines SL, the counter electrodes CM tend to return to the original potential easily. Note that in a case where the switching elements 41 are constituted by p-channel type MOS transistors, as illustrated in FIG. 11A, the gate is connected to the wiring line SVB to which the signal supplied to the control voltage wiring line SV being inverted is supplied, the drain is connected to the sensor wiring line 40, and the source is connected to the common voltage wiring line CV. In a case where the switching elements 41 are composed of CMOS transistors, as shown in FIG. 11B, the gate of the p-channel MOS transistor is connected to the wiring line SVB similar to that of FIG. 11A, the gate of the re-channel MOS transistor is connected to the control voltage wiring line SV, the drain is connected to the sensor wiring line 40, and the source is connected to the common voltage wiring line CV.

(6) In the first embodiment described above, four common voltage wiring lines CV1 to CV4 are provided for M counter electrodes CM, and in the second embodiment, two common voltage wiring lines CV1 and CV2 are provided for the M counter electrodes CM. It is sufficient that the common voltage wiring lines CV be provided in more than two and less than M for the M counter electrodes CM.

The display device described above can be described as follows.

A display device according to a first configuration includes: a substrate; a plurality of pixel electrodes disposed on the substrate; M (M is a natural number equal to or greater than three) counter electrodes disposed opposite the plurality of pixel electrodes; M counter electrode wiring lines connected to the M counter electrodes; and N (N is a natural number and 2≤N<M) common voltage wiring lines connected to the M counter electrode wiring lines, wherein counter electrode wiring lines connected to counter electrodes adjacent to each other are connected to common voltage wiring lines different from each other.

According to the first configuration, M counter electrodes are provided on the substrate facing the plurality of pixel electrodes. The M counter electrodes are connected to the M counter electrode wiring lines. The counter electrode wiring lines of adjacent counter electrodes are connected to common voltage wiring lines different from each other. Therefore, in a case where a predetermined voltage different from the other common voltage wiring lines is applied for each of the common voltage wiring lines, little current flows through the common voltage wiring lines in a case where the counter electrode connected to the common voltage wiring line is not shorted to other adjacent counter electrode. On the other hand, in a case where the counter electrode connected to the common voltage wiring line is shorted to other adjacent counter electrode, current flows between the common voltage wiring line and the common voltage wiring line to which the other counter electrode is connected. Thus, it is possible to detect whether or not short-circuit defects of the counter electrodes have occurred by the current flowing in the common voltage wiring lines at the time in which the predetermined voltage is applied for each of the common voltage wiring lines, and it is possible to provide a display device with less short-circuit defects. Because adjacent counter electrodes are connected to common voltage wiring lines that are different from each other, parasitic capacitance occurs in each counter electrode between the counter electrode and the other counter electrode adjacent to the counter electrode. In other words, a difference in parasitic capacitance between each counter electrode and other adjacent counter electrode is unlikely to occur, and variations in parasitic capacitances of the counter electrodes for each of the common voltage wiring lines are reduced. Therefore, even in a case where the potentials of the counter electrodes fluctuate due to the data voltage for displaying the image, a difference in time until the counter electrodes return to the original potentials is less likely to occur, and luminance unevenness is less likely to occur.

In the first configuration, the M counter electrodes may be disposed aligned along a first direction and a second direction different from the first direction, and in the M counter electrodes, a plurality of counter electrodes arranged continuously in the first direction may have a uniform length in the second direction, and a plurality of counter electrodes arranged continuously in the second direction may have a uniform length in the first direction (second configuration).

According to the second configuration, one other counter electrode is adjacent to each side of the counter electrodes. Therefore, compared to a configuration in which a plurality of other counter electrodes are adjacent to each side of the counter electrodes, the number of counter electrodes adjacent to the counter electrodes can be reduced, and the number of common voltage wiring lines can be reduced.

In the first configuration, at least some of the M counter electrodes may be adjacent to, on at least one side of the M counter electrodes, a plurality of other counter electrodes (third configuration).

According to the third configuration, the degree of freedom in the shape and arrangement of the counter electrodes can be improved compared to a case where only one other counter electrode is adjacent to, on at least one side of at least some of the counter electrodes.

In any of the first to third configurations, a control circuit may be further included which is configured to apply, as short-circuit inspection voltage of a counter electrode, a first voltage to a common voltage wiring line of the N common voltage wiring lines, and apply a second voltage different from the first voltage to other common voltage wiring lines to detect a current in the N common voltage wiring lines (fourth configuration).

According to the fourth configuration, in a case where the counter electrode connected to the common voltage wiring line to which the first voltage is applied is shorted to the other adjacent counter electrode, current flows between the common voltage wiring line and the common voltage wiring line to which the other adjacent counter electrode is connected. Therefore, by detecting the current in the common voltage wiring lines by the control circuit, it is possible to detect the presence or absence of short-circuits of the counter electrodes, and it is possible to provide a display device in which short-circuit defects do not occur.

In the fourth configuration, M switching elements connected to the M counter electrode wiring lines, respectively, may be further provided, wherein the M switching elements are in an on state before the first voltage and the second voltage are applied to the N common voltage wiring lines, and the M counter electrodes are connected to the N common voltage wiring lines via the M common voltage wiring lines in a case where the M switching elements are in an on state (fifth configuration).

In any of the first to fourth configurations, a plurality of source lines connected to the plurality of pixel electrodes and a plurality of gate lines intersecting the plurality of source lines may be further provided, wherein the plurality of gate lines are sequentially scanned, the plurality of source lines are applied with a data voltage corresponding to a predetermined pattern image in a case where each of the plurality of gate lines is scanned, and adjacent source lines are applied with data voltages of mutually different polarities, and each of the N common voltage wiring lines is applied with a predetermined common voltage (sixth configuration).

According to the sixth configuration, every time the gate lines are scanned, a data voltage corresponding to a predetermined pattern image is applied to each of the plurality of source lines. The polarities of the data voltages of adjacent source lines are opposite to each other. A predetermined common voltage is applied to each of the counter electrodes. Adjacent counter electrodes are connected to common voltage wiring lines different from each other, and variations in parasitic capacitances of the counter electrodes for each of the common voltage wiring lines are reduced. Therefore, luminance unevenness does not easily occur even in a case where a black and white image is displayed in a staggered lattice pattern, for example, as a predetermined pattern image.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A display device comprising:
   a substrate;
   a plurality of pixel electrodes disposed on the substrate;
   M (M is a natural number equal to or greater than three) counter electrodes disposed opposite the plurality of pixel electrodes;
   M counter electrode wiring lines connected to the M counter electrodes; and
   N (N is a natural number and $2 \leq N < M$) common voltage wiring lines connected to the M counter electrode wiring lines; wherein
   counter electrode wiring lines connected to counter electrodes adjacent to each other are connected to common voltage wiring lines different from each other;
   the M counter electrodes are at least partially aligned along a first direction and a second direction different from the first direction; and
   in the M counter electrodes, a plurality of counter electrodes arranged continuously in the first direction have a uniform length in the second direction, and plurality of counter electrodes arranged continuously in the second direction have a uniform length in the first direction.

2. The display device according to claim 1, wherein at least some of the M counter electrodes are adjacent to, on at least one side of the M counter electrodes, a plurality of other counter electrodes.

3. The display device according to claim 1, further comprising:
   a control circuit configured to apply, as short-circuit inspection voltage of a counter electrode, a first voltage to a common voltage wiring line of the N common voltage wiring lines, and apply a second voltage different from the first voltage to other common voltage wiring lines to detect a current in the N common voltage wiring lines.

4. The display device according to claim 3, further comprising:
   M switching elements connected to the M counter electrode wiring lines, respectively, wherein the M switching elements are in an on state before the first voltage and the second voltage are applied to the N common voltage wiring lines, and the M counter electrodes are connected to the N common voltage wiring lines via the M common voltage wiring lines in a case where the M switching elements are in an on state.

5. The display device according to claim 1, further comprising:

a plurality of source lines connected to the plurality of pixel electrodes; and a plurality of gate lines intersecting the plurality of source lines, wherein the plurality of gate lines are sequentially scanned, the plurality of source lines are applied with a data voltage corresponding to a predetermined pattern image in a case where each of the plurality of gate lines is scanned, and adjacent source lines are applied with data voltages of mutually different polarities, and each of the N common voltage wiring lines is applied with a predetermined common voltage.

* * * * *